United States Patent [19]

Woodman, Jr. et al.

[11] Patent Number: 4,744,799
[45] Date of Patent: May 17, 1988

[54] COMBINED SEQUENCER AND INSERTION MACHINE

[75] Inventors: Daniel W. Woodman, Jr., Beverly; Henry L. Wright, Ipswich, both of Mass.

[73] Assignee: USM Corporation, Farmington, Conn.

[21] Appl. No.: 871,722

[22] Filed: Jun. 6, 1986

[51] Int. Cl.⁴ .............................................. H05K 3/30
[52] U.S. Cl. .................. 29/566.3; 29/564.1; 29/564.6; 29/741; 29/759
[58] Field of Search ............. 29/741, 739, 759, 564.1, 29/564.2, 564.6, 566.3; 227/2, 5, 90; 209/548

[56] References Cited

U.S. PATENT DOCUMENTS

| | | | |
|---|---|---|---|
| 3,455,493 | 7/1969 | Ackerman et al. | 83/155 |
| 4,080,730 | 3/1978 | Woodman, Jr. | 29/741 X |
| 4,119,206 | 10/1978 | Woodman, Jr. et al. | 209/548 |
| 4,398,658 | 8/1983 | Snyder et al. | 29/564.1 |
| 4,403,390 | 9/1983 | Woodman, Jr. | 29/564.1 |
| 4,543,705 | 10/1985 | Porterfield et al. | 29/566.3 |
| 4,628,585 | 12/1986 | Sillner | 29/564.6 |

*Primary Examiner*—Carl E. Hall
*Attorney, Agent, or Firm*—Spencer T. Smith

[57] ABSTRACT

A combination electrical component sequencing and inserting machine having a conveyor for receiving components from a source, a verifier for determining acceptability of the component, a blow out station for removing unacceptable components, a transfer station for accepting components from the sequencer, an inspection station for indicating to the machine control the absence of components from the sequence and a repair station adjacent an insertion head for replacing missing components from the sequence. The repair station also functions to test the replacement component prior to placement into the sequence.

8 Claims, 10 Drawing Sheets

COMBINED SEQUENCER AND INSERTION MACHINE

BACKGROUND OF THE INVENTION

1. Field of the Invention

This invention relates to a combined machine that collects components from a variety of sources, positions the components in sequence on a conveyor which transfers the components to another conveyor for transport to a component placement or insertion head.

2. Summary of the Prior Art

It has been conventional in the process of automatically assembling axial lead electrical components to printed circuit boards to have a plurality of taped series of identical components aligned on a machine which removes the components from the tape and places them in a predesigned sequence on a conveyor. The conveyor then transports the components through a retaping station so that components are taped in the desired sequence for insertion into the board. A machine of this latter type is illustrated in commonly owned U.S. Pat. No. 4,119,206. Thereafter, the taped roll of sequenced components is placed on an insertion machine which removes the components from the tape, bends the component leads and inserts the leads down through preselected openings in the printed circuit board. A cutclinch unit located beneath the board cuts off excess lead wire and bends the wire over to physically fasten the component to the board. Machines of this latter type are illustrated in commonly owned U.S. Pat. Nos. 4,080,730 and 4,403,390.

It is desirable, however, to combine the functions of the sequencing and inserting machines into a single machine. U.S. Pat. No. 3,455,493 illustrates a machine of this latter type.

SUMMARY OF THE INVENTION

It is an object of this invention to provide a combined sequencing and insertion machine in which a conveyor receives components from dispensers which remove components from a taped series in a predetermined sequence, the conveyor delivers the sequenced components at a transfer station to another conveyor which transports the components to an insertion head which bends the component leads and inserts the leads into preselected openings in a printed circuit board. A cutclinch unit then attaches the component to the board.

It is still a further object of this invention to provide two drive modes between a sequencing conveyor and conveyor for transporting components to an insertion head, one drive mode permitting the conveyors to be operated in timed relation while a second drive mode permits the conveyors to be operated independently. In the first drive mode, the drive to the sequencing conveyor drives the transport conveyor and in the second drive mode, the drive to the insertion head drives the transport conveyor. The first drive mode is to recharge the transport conveyor and the second drive mode is the automatic indexing while inserting components into the printed circuit board.

It is another object of this invention to provide in a combined sequencing and inserting machine a component repair and test station at the insertion head which permits the operator to insert into a sequence of components a missing component resulting from a component testing inadequate at the sequencer or failing to be properly transferred between the sequencer and the inserter.

It is a further object of this invention to provide a combined component sequencing and insertion machine wherein the components are body centered and lead trimmed at the sequencing station and lead centered and lead trimmed at the insertion station.

It is also an object of this invention to provide a combined component sequencing and insertion machine wherein the components are tested and faulty components removed at the sequencing station, and faulty components replaced at the insertion station.

It is another object of this invention to provide a component inspection station downstream from a transfer station positioned between a sequencing station and insertion station of a combined axial lead component sequencing and insertion machine.

DESCRIPTION OF THE PREFERRED EMBODIMENT

Figure 1:
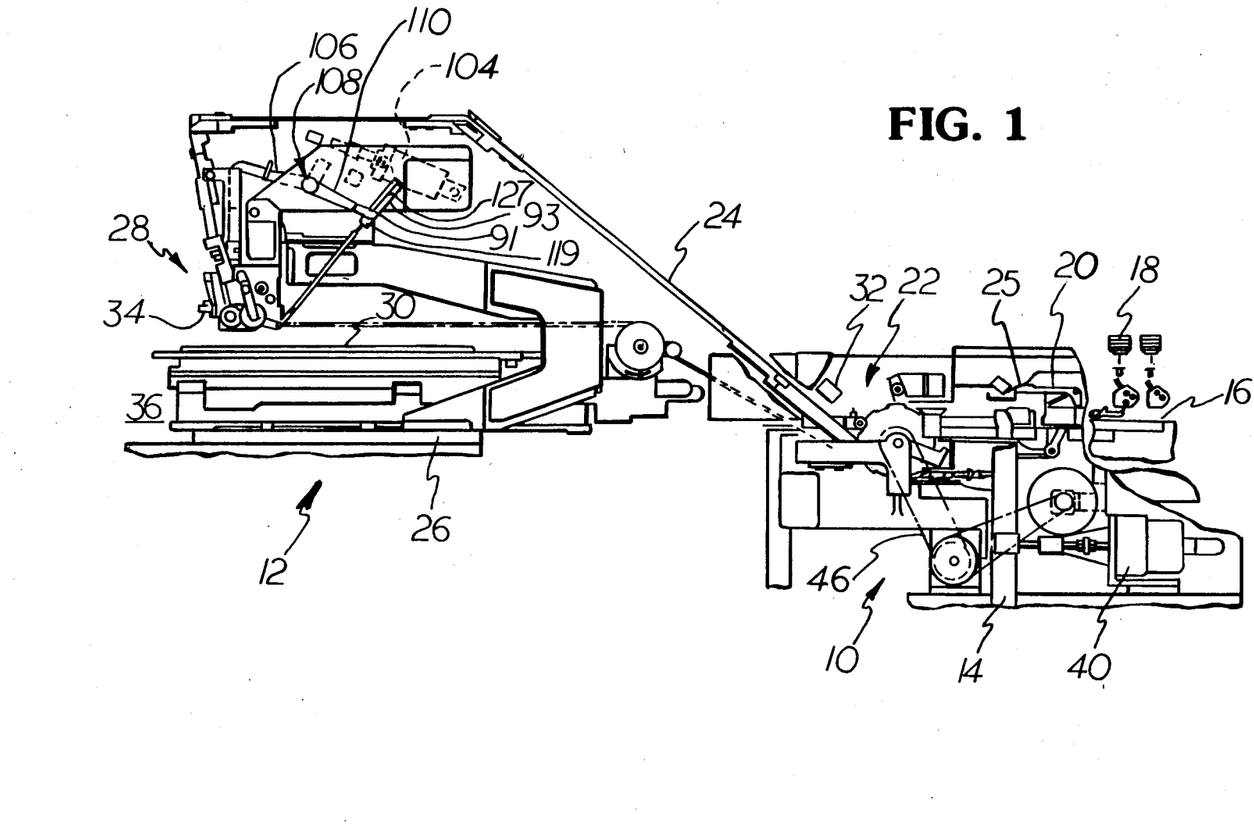
FIG. 1 is an illustration of the combined sequence and inserting machine of this invention.

Attention is directed to FIG. 1 which illustrates side by side free standing sequencing machine 10 and inserting machine 12. The sequencing machine is of the type illustrated in U.S. Pat. No. 4,119,206 and includes a base 14 supporting a driven conveyor 16 which receives components from dispensers 18 which remove components from taped reels (not shown) in a predetermined sequence and place the components on the conveyor. The components are passed through a verifier 20 to determine the acceptability of the component. Unacceptable components are blown off the conveyor by blower 25 leaving a blank space in the sequence. Also, if there is a component missing in the sequence at the verifier, the machine will stop so the operator can inspect for faults in the sequencer.

Thereafter, the components pass through the transfer station 22 onto the transport conveyor 24 which conveys the components to the insertion machine. The insertion machine is of the type illustrated in U.S. Pat. Nos. 4,080,730 and 4,403,390 and has a base 26 supporting an insertion head 28 which receives the components, forms the leads into a staple shape and inserts the leads into preselected openings of a printed circuit board which is carried on the assembly table 30 of the insertion machine. Located downstream from the transfer station 22 is an inspection station 32 which will tell the machine control the location of missing components in the sequence occurring from components not being properly transported through the transfer station 22. If an inadequate component was removed at the verifier, the machine control will tell the inspection station that a blank space in the sequence is coming and should be ignored. If, however, a component does not properly pass through the transfer station, the inspection station will notice the absence of the component and stop the machine so the operator can check for a jammed area, for example, in the transfer station. The machine control will automatically stop the entire combined machine when the missing component in the sequence reaches the repair station 34 located at the operator's station 36 at the insertion head 28. Further, the machine control will designate to the operator the particular component that must be replaced and the operator can then test and replace the missing component into the sequence of components to be inserted into the board, as will be described hereinafter.

In the operation of the combined machines, there are two drive modes, one in which the sequencer 10 and the transport conveyor 24 are driven by the sequencer drive mechanism and the other drive mode in which the transport conveyor 24 is indexed by the insertion head independently of the sequencer drive mechanism. The purposes of the first drive mode is to recharge the transport conveyor 24 with components during machine set up. The second drive mode is the normal automatic indexing of the transport conveyor 24 as the insertion head removes components from the transport conveyor 24 and automatically inserts the components into the printed circuit board.

Figure 2:
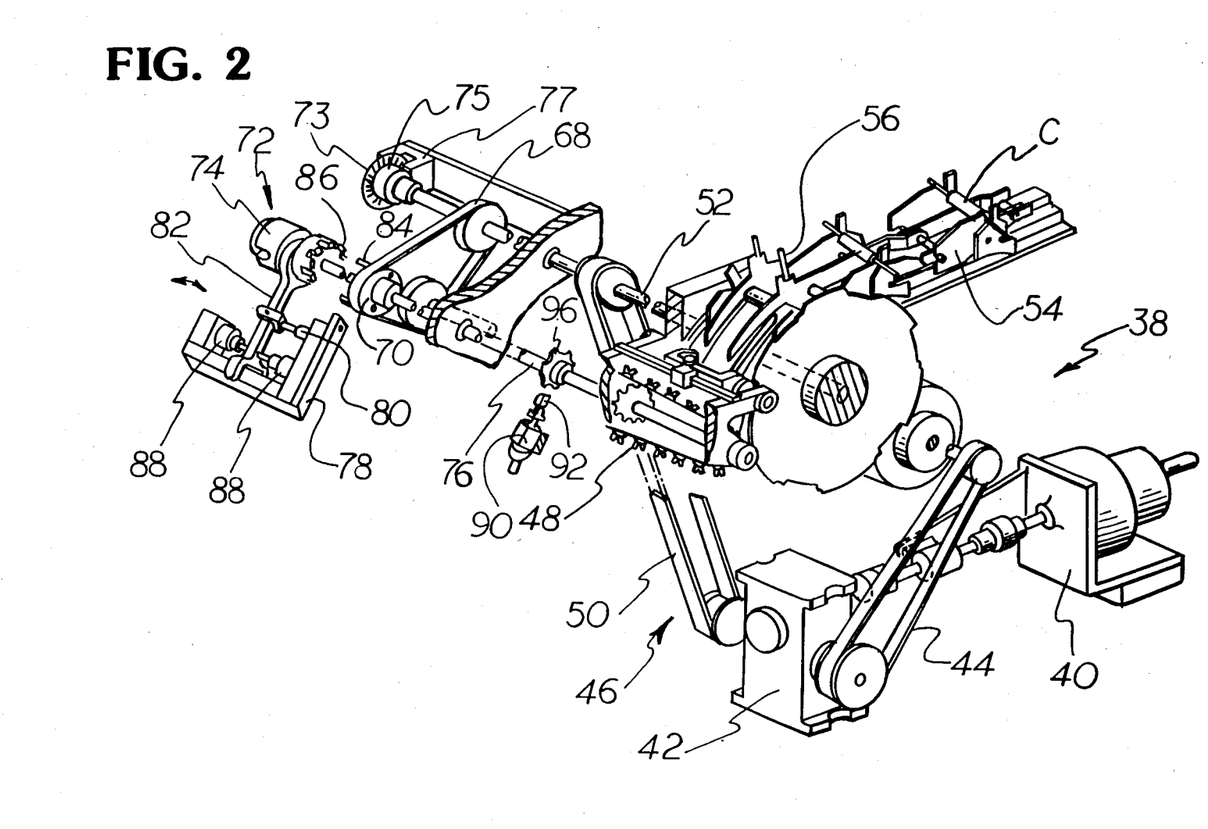
FIG. 2 is an exploded perspective view of the drive between the sequencer and the transport conveyor.
Figure 3A:
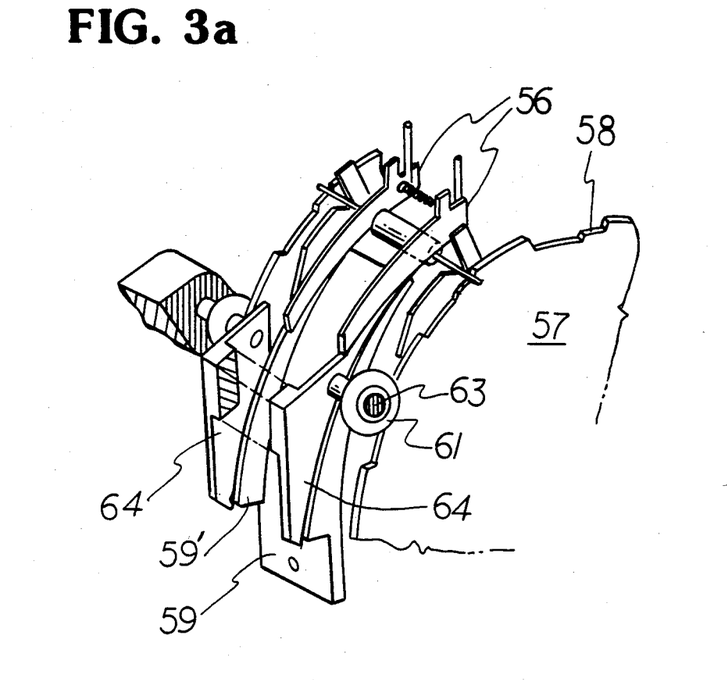
FIGS. 3a to 3b are views illustrating the body centering and lead trimming mechanism.
Figure 3B:
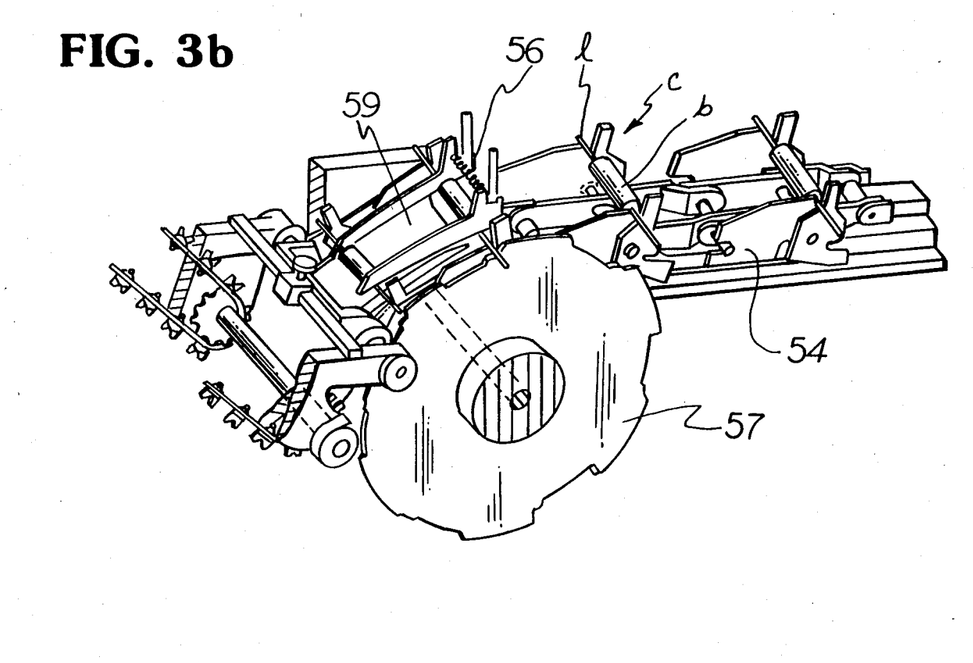
Figure 4A:
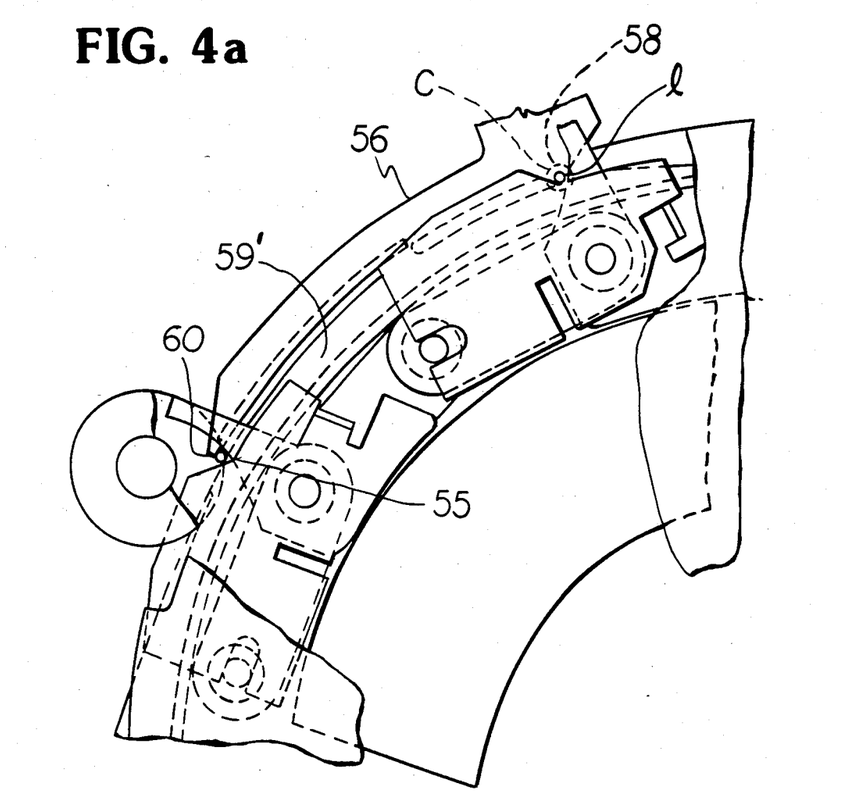
FIGS. 4a to 4c are views illustrating the various positions of the component while passing through the body centering and lead trimming mechanism.
Figure 4B:
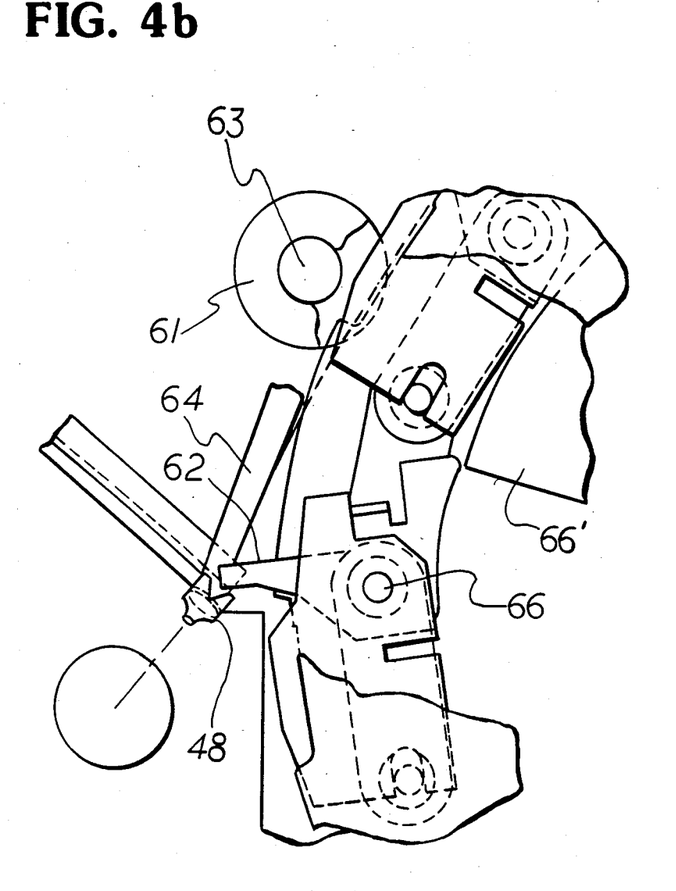
Figure 4C:
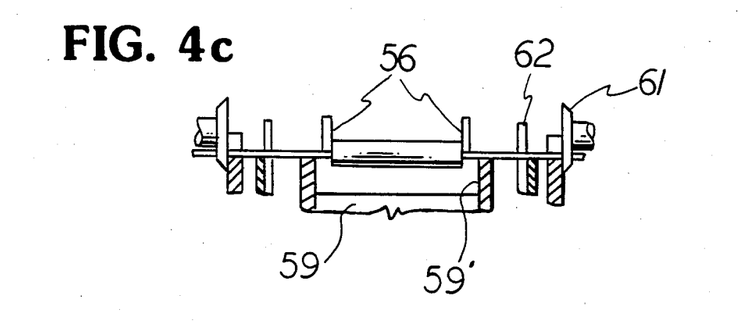

Attention is now directed to FIG. 2 which illustrates the common drive mechanism 38 for the sequencer 10 and the transfer station 22 which is used to load up an empty transport conveyor 24. A motor 40 drives a gear box 42 which has an output drive 44 to the verifier of the sequencing machine and an output drive 46 to drive both the sequencer 10 and the conveyor 24. The conveyor 24 comprises a pair of timing belts 101 retained in tracks 98 and each timing belt has clips 48 for receiving the component leads. The conveyor 24 will be described in greater detail hereinafter.

A drive belt 50 drives a shaft 52 which drives the chain 54 of the conveyor 16. The components (C) are deposited on the conveyor chain 54 by the dispensers 18. The conveyor chain 54 passes the components through the verifier 20 which has a blow-out station 25 which removes inadequate components from the chain 54.

FIGS. 3a and 3b and 4a to 4c illustrate the sequence of the component being passed through the body centering fingers 56, the leads (L) being trimmed and the component being deposited in the clips 48.

As the components (c) are carried along in the cavity 55 of the sequencer conveyor chain 54, they approach the driving cutter wheels 57 which have shoulders 58 which contact the component leads (L) and raise the leads out of the cavity 55 so that the component is supported on the shoulders 58 of the wheels 57. (See FIG. 4a). Thereafter, the component body (b) passes through the centering fingers 56 which center the component body (b) between the wheels 57. The downward load of the fingers 56 is resisted by the undersurface of the component leads (L) being supported by the arcuate uprights 59' of the support 59 carried on the machine frame (not shown). As the component passes through the ends 60 of the fingers 56, the leads are trimmed between the shoulders 58 of wheels 57 and the outboard small cutter wheels 61. (See FIGS. 4a and 4c). The shoulders 58 and arcuate uprights 59' are taken from different center lines and after the leads are trimmed, the shoulders 58 drop away from the surface 59 and the component body (b) is dragged along surface 59 by the uprights 62 of the chain 54. Pivotally supported on the cutter wheel shaft 63 is a door 64 (see FIG. 4) which contacts the upper surface on the component leads so that the leads are retained between the door 64 and surface 59' as it is pushed along by the uprights 62. Thereafter, the component leads are positioned down into the clips 48 and the door 64 closes above the component leads to prevent the components from falling out of the clips. (See FIG. 4c). At this time, the uprights 62 which are pivoted at 61 fall off cam 66' and pass by the component leads so that the leads are securely positioned in the clips 48 without being bent during the transfer from the sequencer to the transport conveyor 24.

The shaft 52 drives a belt 68 coupled to the free wheeling disc 70 of the clutch 72. The opposite side 74 of clutch 72 is keyed to the shaft 76 which drives the conveyor 24. Mounted on a bracket 78 is a cylinder 80 secured to the yoke 82 controlling the position of clutch member 74. The clutch member 74 has slots 86 and cylinder 80 will slide clutch member 74 on shaft to 76 to engage the pins 84 in slots 86 to drivingly couple shaft 52 to shaft 76 to drive the conveyor 24. In the movement of the cylinder 80, the cylinder bottoms out in both directions which determines the stroke of clutch member 74. If the clutch member 74 has not properly moved in the desired direction, limit switches 88 will not be activated to tell the machine control the clutch is properly operating. In the above described recharged mode where it is desirable to get components to the head quickly, the clutch 72 is engaged to couple the drive to the sequencer chain and the drive to the transfer conveyor together. An interupter disc 73 carries indication 75 read by photo cell 77 to tell the machine control when the conveyors 16 and 24 are synchronized on machine setup.

Figure 5:
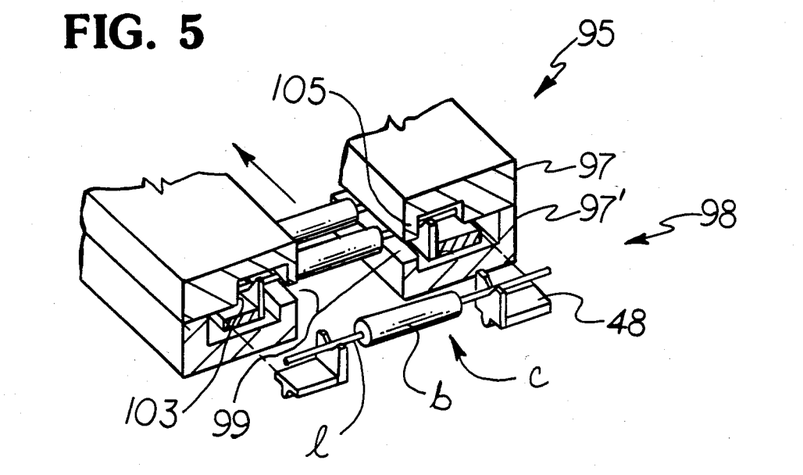
FIG. 5 is a perspective view of the transport conveyor.

Attention is now directed to FIG. 5 which illustrates details of the transport conveyor 24. The tracks 98 comprise a pair of opposed guides 95 mounted to the machine frame. The guides 95 comprises upper and lower elongated housings 97 97' having spaced opposed openings 99 for receipt of the component leads. Carried in the guides 95 are timing belts 101 on which clips 48 are mounted. As the belts 101 are driven, the clips 48 retain the leads (e) and the leads are received in the openings 99 with their ends adjacent the shoulders 103 of housings 97 so the leads are laterally retained while being transported normal to their longitudinal axis. Also, the upper lip 105 of the housing 97 keeps the component from falling out of the clips while being carried along by the clips 48.

Figure 6:
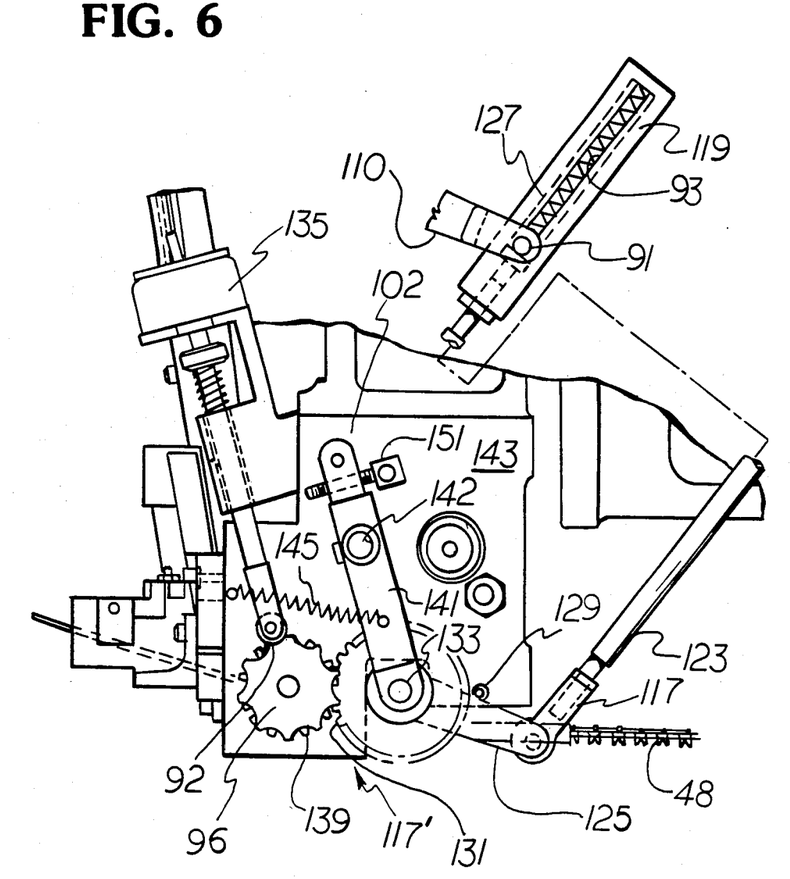
FIG. 6 is a side elevational view of the details of the insertion head drive for the transport conveyor; and, FIGS. 7 to 9 are views of the repair station.
Figure 8:
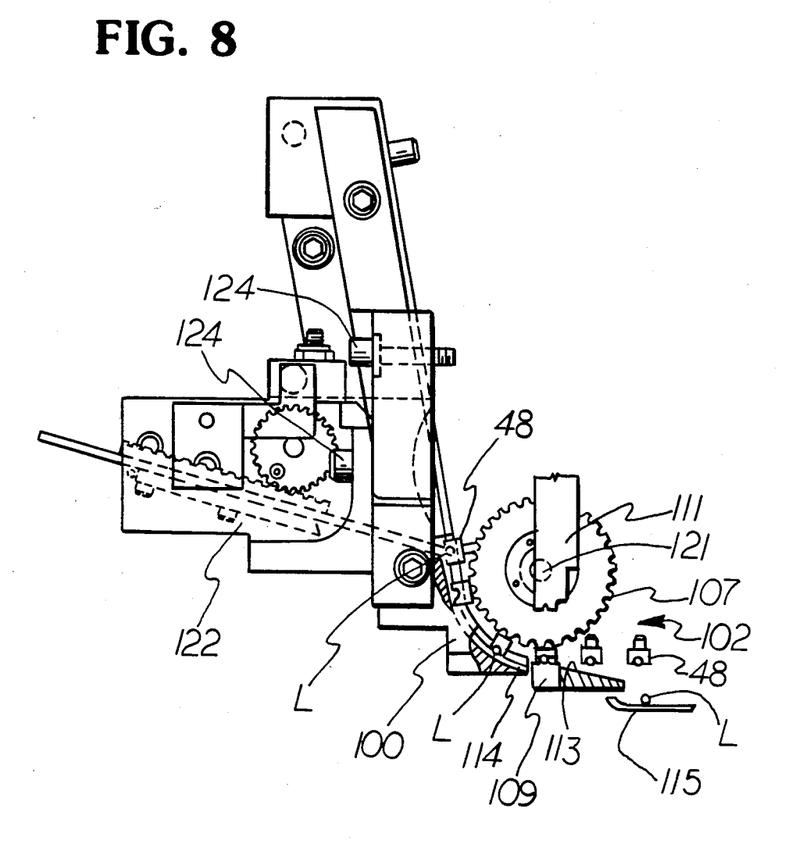

Attention is now directed to FIGS. 1, 6, and 8 which illustrate the operation of the insertion head 28 and the drive for the belts 101 during the automatic insertion operation. The components (c) are carried by the belts 101 to a position above the insertion head. The belts 101 then travel downwardly and under the insertion head around sprockets 107 carried on shafts 121. The components pass through a guide chute 100 which has lead centering surfaces 116 which center the components and positions the components for lead trimming, forming and inserting by the head tooling 102. (See FIG. 8). The components are taken off the end 114 of chute 100 by clips 48 and positioned on shear block 109. Thereafter, the upper shear block 111 trims the leads and the scrap is carried by clips 48 off the shear block 109 and it (See FIG. 8) and falls down ramp 113 into a collection bin 115.

The insertion head 28 is operated by the cylinder 104 which pivots the arm 106 of linkage 108 attached to the insertion head. The arm 110 of link 108 drives indexing mechanism 117 which indexes the sprocket 107 to drive the timing belts 101. As the insertion head moves down, the arm 110 is pivoted upward causing pin 91 to move in slot 93 of housing 119 against the bias of spring 127. The bottom 123 of arm 117 carries link 125 connected to shaft 133 through a one way clutch (not shown). As the insertion head is lowered, the arm 117 is moved upward and the link 125 strikes stop 129. At this time, the clutch 72 is disengaged and the solenoids 135 and 90 (FIG. 2) are engaged to lock the shafts 121 and the shaft 76. There are two shafts 121 and two solenoids 135 one located on each side of the head. Also, in the sequence of operation, the sequencer at this time is depositing a component into the next stationary clip 48 in the sequence at the transfer station. The solenoids 135 and 90 each have rollers 92 which engage star wheels 96 on the shafts 121 and 76 to lock the shafts in fixed positions, with a pair of clips 48 positioning a component directly under the insertion head tooling.

As the insertion head is raised, the arm 110 will be lowered until the pin 107 bottoms out in slot 93 which will move arm 117 downward rotating link 125 clockwise (FIG. 5). At this time, the solenoids 90 and 135 are disengaged removing rollers 92 from star wheels 96 leaving the shaft 74 and shafts 121, free to rotate. The link 125 drives gear 131 through a one way clutch (not shown) on shaft 133 and indexes gear 139 on shafts 121 counter clockwise one incremental spacing of clips 48 to place another component under the insertion head. The shaft 133 is carried on a link 141 pivoted at 142 on the head casting 143. A tension spring 145 is secured between the link 141 and the head casting to bias gear 131 toward gear 139 to obtain zero blacklash there between. An adjustable stop 151 limits the pivotal movement of the link 141 and permits accurate adjustment of the drive between gear 131 and gear 139.

Figure 7:
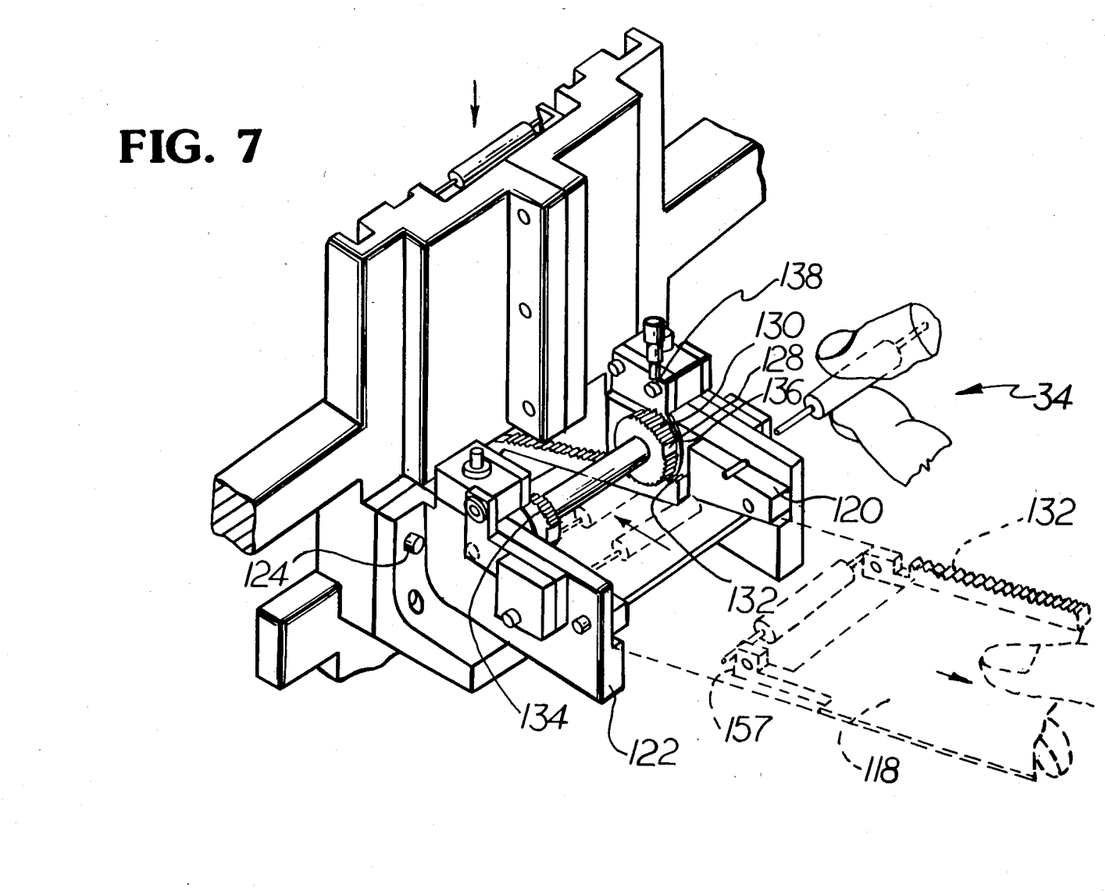
Figure 9:
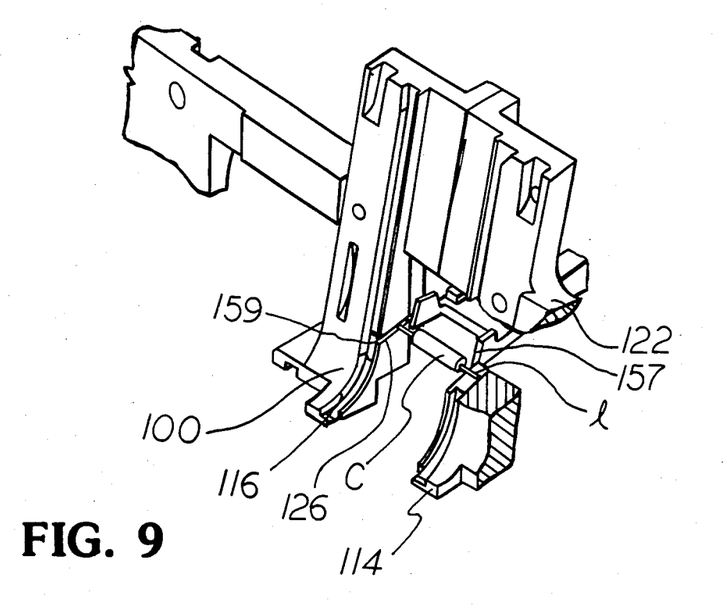

Reference is now made to FIGS. 7 to 9 which illustrate the chute 100 and the repair station 34. The components are moved through the chute 100 by the clips 48 (see FIG. 5) until they are carried off the end 114 of the chute by the clips 48 and onto the shear block 109 of the insertion head tooling 102.

Located in the chute 100 is the repair station 34 which comprises a door 118 slidably disposed on the sides 120 of the housing 122 attached to the chute 100 by bolts 124. When a blank occurs in the sequence, the machine will stop with the empty clips 48 in front of the slots 126 (See FIG. 7) in the repair station. The machine control will tell the operator the component to select and the operator will place the component on the shelfs 120 and in the relieved areas 128 of drive wheel 130. As the door is withdrawn from the closed position, the racks 132 engage the teeth 134 on wheels 130 rotating the wheels 130 passing the component leads through the contacts 136, 138 to test the component. If the component test adequate, then the door can be further withdrawn and the wheels 130 rotated to dump the component leads into the slots 126. At this position, the component is in front of the leading edge 157 of the door 118. As the door is inserted and closed, the leading edge 157 places the component leads into the clip 48. Also, the leading edge 157 of door 118 closes the gap 159 in the track formed by slot 126. If the replacement component does not test adequate, the door is returned to the closed position; and by removing the component, another replacement component can be tested.

In the above manner, a separate sequencing and inserting machine can be used together to verify components, body center and lead trim components, inspect for missing components and repair the sequence of components at the operator's station at the insertion head.

We claim:

1. A combination axial leaded electrical component sequencing and inserting machine for placing the components on a printed circuit board comprising:
    a. a sequencer conveyor for receiving components from a source;
    b. a verifier adjacent said sequencer conveyor for checking the acceptability of the component;
    c. means for removing unacceptable components from said sequencer conveyor;
    d. a component transfer station adjacent said sequencer conveyor for receiving the components and including a transport conveyor to convey the components;
    e. a component insertion means for receiving the components from said transport conveyor and positioning the components on the board;
    f. means for driving said sequencer conveyor,
    g. means for interconnecting said sequencer and transport conveyors and operating said driving means for conjointly displacing said sequencer and transport conveyors;
    h. means for driving said transport conveyor, and
    i. means for disconnecting said sequencer and transport conveyors and operating said transport conveyor driving means so that said transport conveyor is driven while said sequencer conveyor is idle.

2. The machine of claim 1 including an inspection station adjacent said transport conveyor functioning to determine the absence of components in the sequence.

3. The machine of claim 1 including a repair station at the insertion means.

4. The machine of claim 1 wherein said transport conveyor includes clips to hold the component leads and said transfer station includes upper and lower supports for the component, said upper support being pivotal to a position to securely place the component leads into said clips.

5. The machine of claim 1 wherein said conveyor includes means to center the component body and trim the leads.

6. The machine of claim 1 wherein said insertion means includes means to lead center the component and trim the leads.

7. The machine of claim 5 including a repair station adjacent said insertion means functional to replace missing components in the sequence.

8. The machine of claim 6 including inspection means adjacent the transport conveyor functional to determine the absence of components in the sequence.

* * * * *